United States Patent
Martin et al.

(10) Patent No.: US 10,741,888 B2
(45) Date of Patent: Aug. 11, 2020

(54) MULTI-CHANNEL AND BI-DIRECTIONAL BATTERY MANAGEMENT SYSTEM

(71) Applicant: Tesla, Inc., Palo Alto, CA (US)

(72) Inventors: Nathaniel Martin, Alameda, CA (US); Ania Mitros, Mountain View, CA (US); Charles Mellone, Redwood City, CA (US); Ian Dimen, Berkeley, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/022,544

(22) Filed: Jun. 28, 2018

(65) Prior Publication Data

US 2019/0006723 A1 Jan. 3, 2019

Related U.S. Application Data

(60) Provisional application No. 62/527,834, filed on Jun. 30, 2017.

(51) Int. Cl.
*H01M 10/48* (2006.01)
*H02J 7/00* (2006.01)
(Continued)

(52) U.S. Cl.
CPC ........ *H01M 10/482* (2013.01); *G01R 31/382* (2019.01); *G01R 31/396* (2019.01);
(Continued)

(58) Field of Classification Search
CPC .......................... H01M 10/482; G01R 31/382
See application file for complete search history.

(56) References Cited

U.S. PATENT DOCUMENTS 4,937,811 A    6/1990   Harris
5,687,014 A * 11/1997   Czerwiec ............... H04J 3/1611
                                                          348/E7.094
(Continued)

FOREIGN PATENT DOCUMENTS

CN     101860053     10/2010
CN     102843331     12/2012
(Continued)

OTHER PUBLICATIONS

International Search Report dated Sep. 25, 2018, in International Patent Application No. PCT/US18/40140, filed Jun. 28, 2018 (2 pgs).

(Continued)

*Primary Examiner* — Richard V Muralidar
(74) *Attorney, Agent, or Firm* — Knobbe, Martens, Olson & Bear, LLP (57) ABSTRACT

Embodiments of the present invention include a battery management system that provide a plurality of channels that allow communication between host and clients. This communication may operate in bi-directional modes such that commands from the host and responses from the clients are transmitted clockwise or counter-clockwise around a daisy-chain loop. This architecture provides both a high level of redundancy across multiple channels as well as transmission directions around the loop. The use of multiple channels provides a separation in signal paths akin to the provision of completely separate physical wires, preventing malfunction of spurious operation of devices using one channel from interfering with the normal operation of devices using the other channel. In addition, the signaling architecture allows a host to dynamically transmit commands and receive responses between specific client(s) and host or broadcast communication across all clients.

23 Claims, 8 Drawing Sheets

(51) Int. Cl.
*H01M 10/42* (2006.01)
*H02J 7/34* (2006.01)
*G01R 31/382* (2019.01)
*G01R 31/396* (2019.01)
*H02J 13/00* (2006.01)
*G01R 35/00* (2006.01)

(52) U.S. Cl.
CPC ..... *H01M 10/425* (2013.01); *H01M 10/4207* (2013.01); *H02J 7/0016* (2013.01); *H02J 7/34* (2013.01); *H02J 13/0003* (2013.01); *G01R 35/00* (2013.01); *H01M 2010/4271* (2013.01); *H01M 2010/4278* (2013.01); *H02J 7/0022* (2013.01)

(56) References Cited

U.S. PATENT DOCUMENTS

| | | |
|---|---|---|
| 2004/0071238 A1 | 4/2004 | Khlat |
| 2005/0058390 A1 | 3/2005 | Iwai |
| 2008/0180106 A1 | 7/2008 | Gorbold |
| 2010/0188972 A1* | 7/2010 | Knapp ............... H04L 12/43 370/226 |
| 2010/0259221 A1 | 10/2010 | Tabatowski-Bush |
| 2011/0101920 A1 | 5/2011 | Seo et al. |
| 2011/0267854 A1 | 11/2011 | Flannery et al. |
| 2012/0203482 A1 | 8/2012 | Parle |
| 2013/0066572 A1 | 3/2013 | Terashima et al. |
| 2013/0141230 A1 | 6/2013 | Chandler et al. |
| 2013/0286942 A1 | 10/2013 | Bonar |
| 2013/0293251 A1 | 11/2013 | Martin |
| 2013/0294530 A1 | 11/2013 | Martin |
| 2014/0040242 A1 | 2/2014 | Zhou |
| 2014/0129164 A1 | 5/2014 | Gorbold |
| 2014/0147713 A1 | 5/2014 | Mizobe |
| 2014/0212714 A1 | 7/2014 | Butzmann |
| 2016/0025795 A1* | 1/2016 | Martin ............ G06F 13/4247 324/503 |
| 2017/0010329 A1 | 1/2017 | Tang et al. |
| 2017/0177048 A1* | 6/2017 | Dimen ............... G06F 1/26 |

FOREIGN PATENT DOCUMENTS

| | | |
|---|---|---|
| CN | 102918739 | 2/2013 |
| EP | 1 099 119 | 5/2009 |
| EP | 2 663 028 | 11/2013 |
| JP | 2007-042501 | 2/2007 |
| JP | 2010-246372 | 10/2010 |
| JP | 2013-078233 | 4/2013 |
| KR | 1020130142184 | 5/2015 |

OTHER PUBLICATIONS

Witten Opinion of the International Searching Authority dated Sep. 25, 2018, in International Patent Application No. PCT/US18/40140, filed Jun. 28, 2018 (7 pgs).

* cited by examiner

MULTI-CHANNEL AND BI-DIRECTIONAL BATTERY MANAGEMENT SYSTEM

CROSS-REFERENCE TO RELATED APPLICATIONS

This application claims the priority benefit under 35 USC § 119(e) to U.S. Patent Application No. 62/527,834, filed on Jun. 30, 2017, entitled "MULTI-CHANNEL AND BI-DIRECTIONAL BATTERY MANAGEMENT SYSTEM," listing as inventors Nathaniel Martin, Ania Mitros, Charles Mellone, Ian Dimen, which application is incorporated by reference herein in its entirety and for all purposes.

BACKGROUND

A. Technical Field

The present invention relates to a closed loop signaling architecture for the management of battery cells within a system, and more particularly, to battery management systems and methods that provide bi-directional signaling and redundant paths across a plurality of serially-coupled battery modules.

B. Description of the Related Art

The importance of battery-based power systems within today's markets is well understood by one of skill in the art. These battery systems are replacing traditional power systems in a number of different markets as products are moving towards more environmentally-friendly and cost-effective power solutions. For example, markets such as the electrical vehicle and home energy markets are experiencing rapid growth as battery powered systems are becoming more dynamic in their ability to store and deliver power to corresponding products. This movement away from traditional power sources (e.g., fossil fuels, coal, etc.) to battery-based power sources is placing higher performance demands on the management of battery cells to ensure proper operation within ever-increasing complex products.

Many battery-based power systems have a centralized management controller that communicates with multiple battery management integrated circuits. Each of these battery management integrated circuits manages a plurality of battery cells and performs various tasks. For example, a battery management integrated circuit may sense voltage and charge levels on battery cells, may manage charge by bleeding charge or re-charging cells, as well as perform other sensing operations and low-level battery management functions. Battery management systems should also be sufficiently robust to effectively address interference issues within the battery system, provide appropriate electrical isolation between various components as well as power domains, and be able to compensate for failure events within the system and other features known to one of skill in the art.

In the case of electric vehicles, the battery management system may be subject to mechanical vibration and shock, varying environmental temperature, multiple power domains and a large number of interference sources that may deteriorate signals between the centralized management controller and multiple battery integrated circuits. These problems may create issues in the viability of traditional battery management systems being ported into electric vehicles. These problems are compounded by the fact that the battery system oftentimes functions as the only power source for the vehicle, and a failure within the battery system will result in rendering the automobile inoperable.

Accordingly, what is needed is battery management systems that provide more robust and dynamic management of battery cells.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components or nodes. Components may be implemented in software, hardware, or a combination thereof.

Furthermore, connections between components within the figures are not intended to be limited to direct connections. Rather, data between these components may be modified, re-formatted, or otherwise changed by intermediary components or devices. Also, additional or fewer connections may be used. It shall also be noted that the terms "coupled" "connected" or "communicatively coupled" shall be understood to include direct connections, indirect connections through one or more intermediary devices, and wireless connections.

Furthermore, one skilled in the art shall recognize: (1) that certain steps may optionally be performed; (2) that steps may not be limited to the specific order set forth herein; and (3) that certain steps may be performed in different orders, including being done contemporaneously.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. The appearances of the phrases "in one embodiment," "in an embodiment," or "in embodiments" in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

According to various embodiments of the invention, a battery management system is disclosed having multi-channel and bi-directional signaling procedures are employed to improve the performance and redundancy of the system. A master-slave architecture is used such that a host (e.g., a microcontroller) that manages the batteries at a system level by communicating with a plurality of low level battery management integrated circuits that directly manage battery cells. These signaling procedures allow commands and responses to travel in either a clockwise or counter-clockwise direction across a closed-loop transmission path that serially couples the low-level battery management integrated circuits.

In various embodiments, the transmission path is able to communicate commands and responses on multiple channels that allow a host to address multiple separate and redundant systems of multiple clients in a variety of communication protocols. For example, a first channel may communicate commands/responses within a first frequency band(s) to a first system of clients and a second channel may communicate commands/responses within a second frequency band(s) to as second system of clients to reduce interference between the two channels and achieve effective separation of the two systems of clients and therefore achieve a higher level of functional redundancy than if client systems shared the same channel on the communication medium. Furthermore, in certain embodiments, the communication protocols may vary across the channels such that a first channel allows the microcontroller to uniquely address a battery management integrated circuit with a specific command while a second channel allows the microcontroller to broadcast a command to all of the battery management integrated circuits and receive responses from each. This signaling method and architecture provides redundancy within the battery management system by allowing multi-channel communication paths between microcontroller and multiple separate and completely functionally redundant systems of battery management integrated circuits. These and other advantages will be apparent to one of skill in the art in light of the discussion below.

Figure 1:
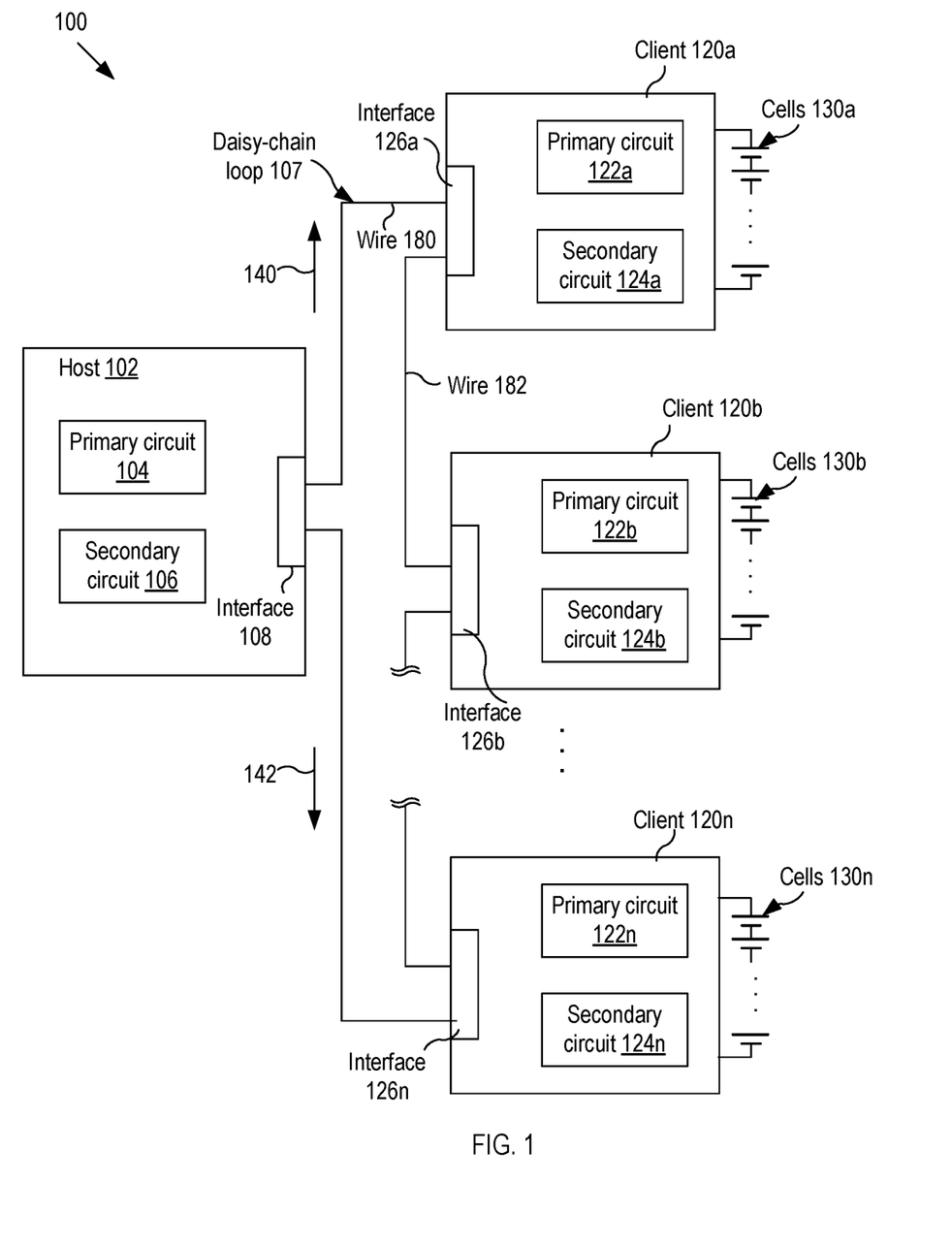
FIG. 1 shows a schematic diagram of a battery management system according to embodiments of the present disclosure.

FIG. 1 shows a schematic diagram of a battery management system 100 according to embodiments of the present invention. The battery management system 100 may include a host 102 (such as a microcontroller that manages at a system level) and clients 120a-120n (such as battery management integrated circuits that manage battery cells within the system). It is noted that other possible arrangements and implementations of the host 102 and clients 120 may be used in the present disclosure. In embodiments, the host 102 may be implemented in various structures including the previously mentioned microcontroller and manages the system by transmitting commands and receiving responses from one or more of the clients 120. Each client 120 may monitor and control corresponding battery cells to measure the electrical and physical status of the cells, such as voltage, amount of remaining electrical charge and temperature of each cell. For instance, the client 120a may monitor the cells 130a. It is noted that each client 120 may monitor different number of battery cells. The client 120a may perform measurements (e.g., voltage, charge, temperature, etc.) as well as perform certain functions (e.g., bleed-off charge from a battery cell, etc.) One skilled in the art will recognize that various implementations and architectures of the battery management system shall fall within the present scope of this disclosure.

The host 102 and each client 120 may communicate commands and responses via a daisy-chain transmission path loop 107, where the daisy-chain loop 107 may include a pair of wires that transmits electrical signals therethrough. In certain instances, this communication may use differential signaling. In embodiments, the daisy-chain loop 107 may connect the interface 108 of the host 102 to the interfaces 126a-126n of the clients 120a-120n in series so that communication may serially occur on one or multiple channels within the loop 107.

The daisy-chain loop 107 may use two or more communication channels where each channel communicates signals in different frequency ranges to parallel, separate systems of battery management clients. To simplify the discussion, the following discussion focuses on a system that has only two channels, a first channel (corresponding to a primary signal) and second channels (corresponding to a secondary signal), even though other suitable number of communication channels may be used in embodiments of the present invention. As discussed below, the host 102 may include a primary circuit 104 and a secondary circuit 106 that process the signals communicated through the first and second channels, respectively. Likewise, each of the clients 120 may include a primary circuit 122 and a secondary circuit 124 that process the signals communicated through the first and second channels, respectively, and of which each client system alone is capable of providing the full complement of battery management functions necessary for safe and continued system operation. The primary circuit 104 processes responses received from one or more of the clients 120 on a first channel within the system. In certain examples, this primary circuit 104 functions as receiver circuitry for the first channel while in other examples the primary circuit 104 functions as a transceiver that receives and transmits signals on the first channel. In examples, the secondary circuit 106 functions as receiver circuitry for the second channel while in other examples the secondary circuit 106 functions as a transceiver that receives and transmits signals on the second channel.

The battery management system 100 is able to provide redundant communication paths because of its ability to bi-directionally communicate along the daisy-chain loop 107 and because the two channels used on the daisy chain loop each allow access to completely separate and redundant battery management systems. Specifically, the host 102 is able to communicate in a clockwise direction 140 around the serially connected clients 120 as well as communicate in a counter-clockwise direction 142 along the loop 107. This bi-directionality allows the host 102 to communicate with each client 120 in case there is a single failure within the daisy-chain loop 107. This redundancy applies to both channels and will be explained in more detail below.

Figure 2A:
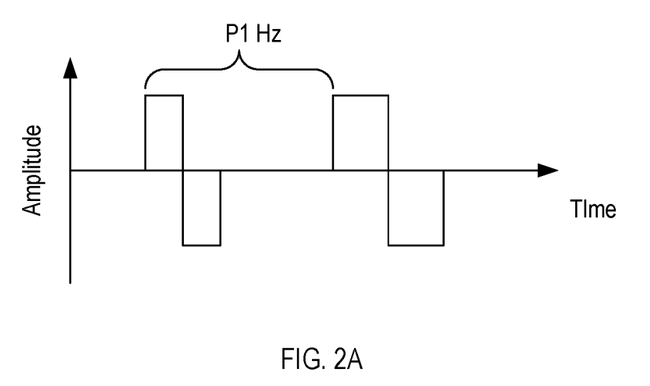
FIG. 2A shows exemplary signals in one communication channel according to embodiments of the present disclosure.
Figure 2B:
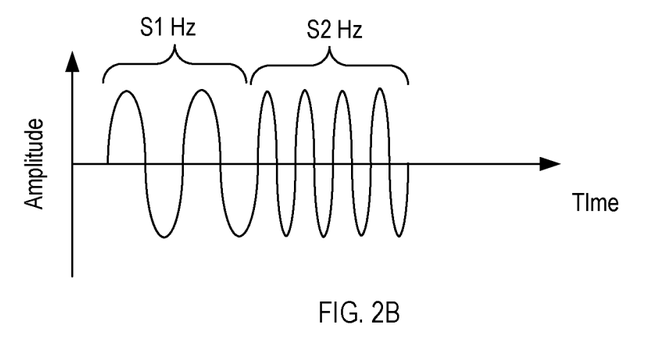
FIG. 2B shows exemplary signals in another communication channel according to embodiments of the present disclosure.

FIGS. 2A and 2B illustrate examples of signaling characteristics that may be used across different channels within the battery management system 100. FIG. 2A shows exemplary signals in one communication channel according to embodiments of the present disclosure. FIG. 2B shows exemplary signals in another communication channel according to embodiments of the present disclosure. In embodiments, the signals in FIGS. 2A and 2B may be transmitted simultaneously by the host 102 through the daisy-chain loop 107 and each client 120 may separate two signals. In other embodiments, the signals in FIGS. 2A and 2B may be transmitted in a time multiplexed approach according to various embodiments of the invention. In these examples, the range of the signal frequency P1 in FIG. 2A may not overlap the range of the signal frequencies S1 (and S2) in FIG. 2B so that the signals can be separated and processed, i.e., the battery management system 100 may have frequency-division multiplexed channels along the transmission loop 107. It is noted that various types of signal shapes may be used in the two channels.

Referring to FIG. 2A, a depicted balanced serial signal is illustrated having a first frequency or frequencies corresponding to the P1 Hz value, for example a 5 MHz signal. In certain embodiments, this balanced serial signal is communicated within the first channel of the system and is able to uniquely address one or more clients within the plurality of clients 120. One skilled in the art will recognize that various communication protocols may be used in the implementation of embodiments of the invention. Comparably, FIG. 2B is an FSK signal in which data is communicated within the second channel using a plurality of frequencies or frequency bands corresponding S1 Hz and S2 Hz. One skilled in the art will recognize that a large number frequencies or frequency bands may be used in the FSK modulation technique. In certain examples, the lowest frequency employed in the second channel is 15 MHz, which would provide sufficient frequency separation to minimize interference between the two channels. One skilled in the art will also recognize that various encoding techniques (e.g., Manchester encoding) may also be used in either or both of the channels. In embodiments, the FSK signal is a broadcast signal that is intended for each of the clients 120 to perform a certain function and respond to the host 102. The host 102 is able to associate a response to a particular client 120 based on the sequence or time-window in which the response is received, which will be described in greater detail below.

Figure 3:
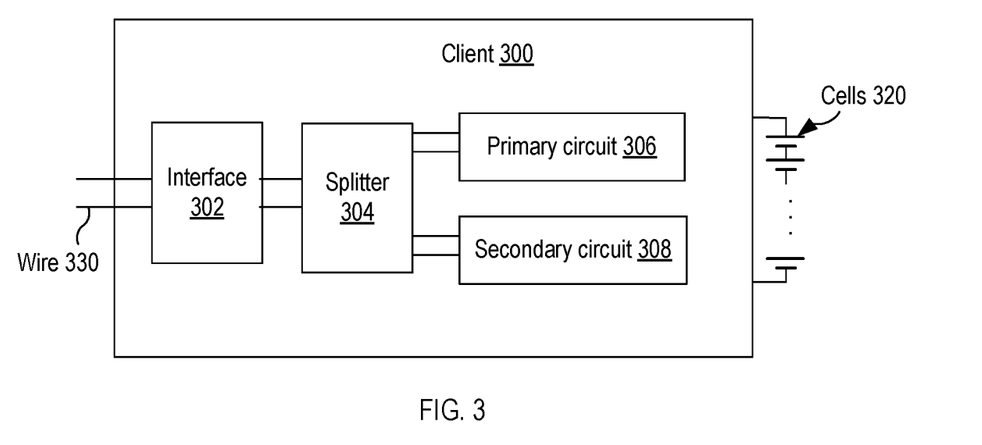
FIG. 3 shows a schematic diagram of a client according to embodiments of the present disclosure.

FIG. 3 shows a schematic diagram of a client 300 according to embodiments of the present disclosure. As depicted, the client 300 may include an interface 302 for receiving and sending signals; a splitter 304 for separating the incoming signal into first and second channel signals; a primary circuit 306 for processing the first channel signal; and a secondary circuit 308 for processing the second channel signal. This splitter architecture achieves a high level of functional redundancy by providing a separation between primary and secondary signal paths akin to the provision of separate sets of wires for primary and secondary circuitry. The effectively physical separation of the communication channels by passive circuitry before the signals meet the primary and secondary battery monitoring circuitry mean that even in cases of malfunction, the primary circuitry cannot interfere with normal operation of the secondary circuitry, and vice versa.

In embodiments, both the primary circuit 306 and the secondary circuit 308 may monitor the cells 320 and send the monitored information to the host 102 in response to the command signal. Hereinafter, the terms "response" and "response signal" refer to the information monitored and transmitted by the circuits 306 or 308. In embodiments, the primary circuit 306 may send a response signal to the host 102 if the host, more specifically, the primary circuit 104 of the host, sends a primary command signal through the first channel. Likewise, the secondary circuit 308 may send a response signal to the host if the host, more specifically, the secondary circuit 106, sends a secondary command signal through the second channel. In one example, the host 102 may send a command to each client 120 to transmit voltage sensor readings that are stored within memory in the client 120. In another example, the host may send a command to each client 120 to take a voltage measurement on each cell 130 and transmit those measurements back to the host 102. One skilled in the art will recognize that various commands and responses may be communicated within the system 100.

One skilled in the art will recognize that each client 102 will differentiate signals between channels and route channels to appropriate processing circuitry 306, 308. For example, the splitter 304 may receive a signal comprising a plurality of channels and split each channel out from the received signal. In certain embodiments, the splitter 304 may employ filters that output on certain frequency bands corresponding to certain channels. One skilled in the art will recognize that the filters may be integrated within the splitter or may be discrete circuitry within the system 100.

The primary and secondary circuits 306, 308 have corresponding circuitry employed on the host 102 such as those shown as a primary circuit 104 and a secondary circuit 106 in FIG. 1. The functionality of these circuits 104, 106 is similar to those described relative to the clients in that this circuitry is intended to process communication occurring in specific channels. In addition, the system 100 may also employ isolation elements that electrically isolate various components to avoid interference and current leakage. These isolation elements may be located between clients 120 or between clients 120 and host 102 in which different power domains are employed.

Figure 4:
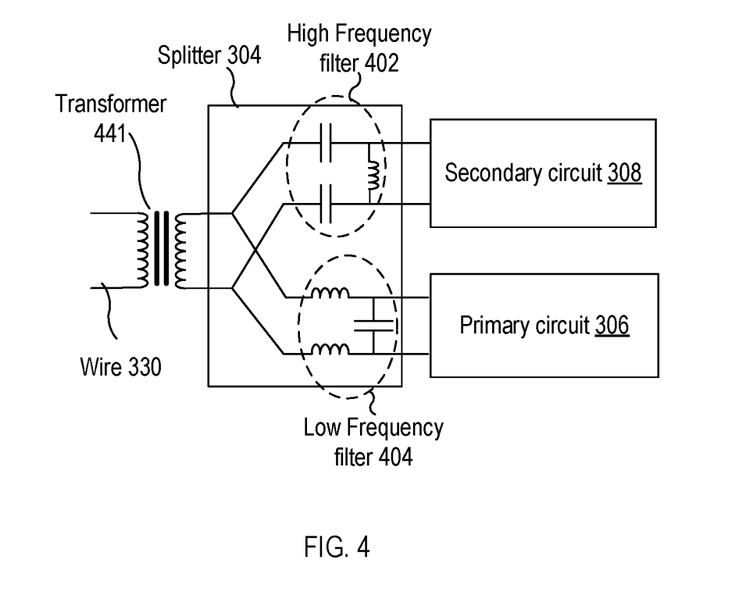
FIG. 4 shows a schematic diagram of a splitter according to embodiments of the present disclosure.

FIG. 4 shows a schematic diagram of a splitter according to embodiments of the present invention. As described, the splitter 304 may include a low frequency filter 404 that passes the low frequency signal of the first channel and a high frequency filter 402 that passes the high frequency signal of the second channel. The low and high frequency signals may be input to and processed by the circuits 306 and 308, respectively. The transformer 441 may isolate the client 300 from the device that is coupled to the other end of the wire 330. It is noted that other suitable electronic circuit may be used in place of the transformer 441 such as photo-couplers or capacitors.

As shown in this Figure, a signal is received from the daisy-chain loop 107 at client 300. The signal is split into a first channel using a low frequency filter 404 having two inductors in parallel and a capacitor that will block the high frequency component on the signal and pass the low frequency component, corresponding to the first channel. Comparatively, a second channel uses a high frequency filter 402 having two capacitors in parallel and an inductor that will block the low frequency component on the signal and pass the high frequency component, correspond to the second channel. One skilled in the art will recognize that the specific designs of the high and low pass filters may vary from application to application, all of which are intended to fall within the scope of embodiments of the invention.

One skilled in the art will recognize the use of a multi-channel signaling system as well as a bi-directional signaling architecture within the battery management system 100 results in dynamic redundancy across the system itself. For example, if a primary or secondary circuit should fail on a client 120, the host 102 may communicate a redundant command to the client 120 using a different and fully operational channel. The multiple channel architecture ensures that even egregious malfunction of a sub-system, such as the transmission of spurious data, will not be able to interfere with normal operation of a complementary subsystem operating on a different channel. In addition, the bi-directionality of the system allows for compensation to occur in the event of a complete path failure somewhere within the loop 107.

Referring back to FIG. 1, in embodiments, the host 102 may send a command signal in two different directions 140 and 142, i.e., the host 102 may operate in a bi-directional mode. In each direction, the host 102 may send command signals through at least one of the two communication channels. For instance, the primary circuit 104 of the host 102 may send a first command signal through the interface 108 and the secondary circuit 106 may send a second command signal through the interface 108 in the direction 140. Similarly, the primary circuit 104 of the host 102 may send a first command signal through the interface 108 and the secondary circuit 106 may send a second command signal through the interface 108 in the direction 142.

In embodiments, the first command signal may request one of the clients to send a response signal to the host 102. For instance, the host 102 may send a first command signal in the first direction 140, where the first command signal requests the client 102*b* to send a response to the host. If one of the wires (or traces) 180 and 182 is broken, the client 120*b* may not receive the command signal, and as a consequence, the host 102 may not receive any response from the client 120*b*. In this scenario, the host 102 may send the first command signal in the second direction 142 and receive the response from the client 120*b*. However, the host 102 may not still be able to identify the exact location of the failure since the host cannot determine which of the two wires (or traces) 180 and 182 is broken or which specific device has failed.

Figure 5:
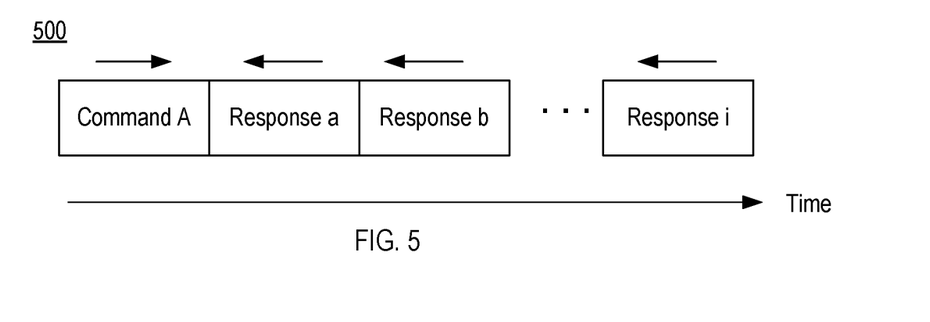
FIG. 5 shows a schematic diagram of a data sequence received by a host according to embodiments of the present disclosure.
Figure 6:
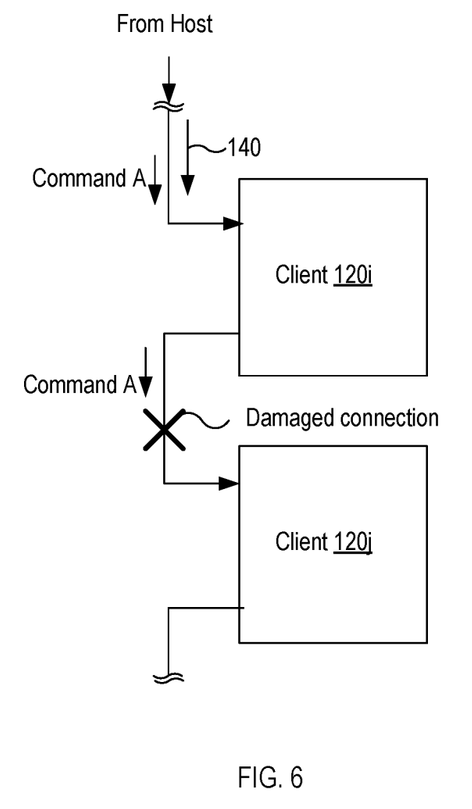
FIG. 6 shows the flow of a command signal in a daisy-chain loop according to embodiments of the present disclosure.
Figure 7:
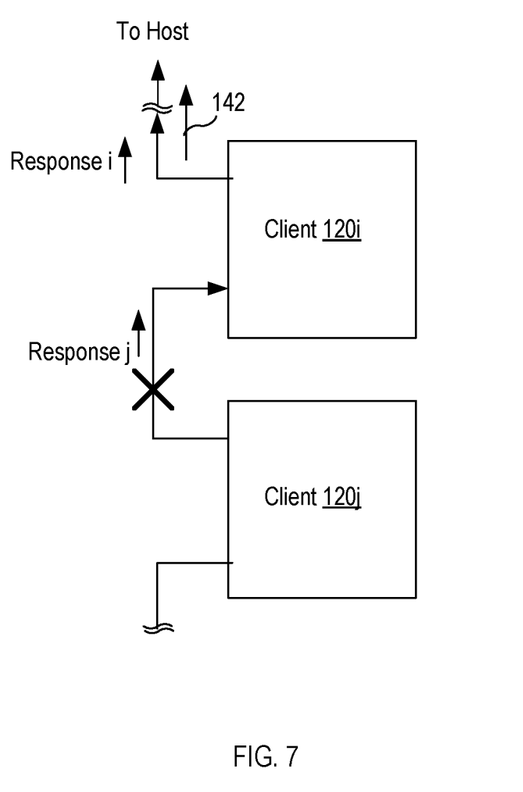
FIG. 7 shows the flow of response signals in a daisy-chain loop according to embodiments of the present disclosure.

A broadcast command signal to all of the clients 120 may provide more visibility into where a failure has occurred. To identify the failure of the daisy-chain loop 107, in embodiments, the host 102 may send second command signal may request all of the clients to send response signals to the host. Because the particular channel broadcasts a command to all of the clients 120, the host 102 can associate each response with a particular client based on the time or location (e.g., response window) of the particular response relative to all of the other responses. FIG. 5 shows a schematic diagram of a data sequence 500 received by a host according to embodiments of the present disclosure. As shown, a broadcast command A is transmitted from the host 102. Each client transmits a response to the command which appear as a series of responses to the host 102. The sequential location of each response can then be associated with each client 102 based on its location within the daisy-chain transmission loop. If a failure occurs, only a subset of responses will be received by the host 102, which will allow the host to at least approximate where the failure occurred. The host 102 can re-transmit the command in the opposite direction to ensure other clients 120 receive the command as well as confirm where the failure is located within the loop 107. FIG. 6 shows the flow of a command signal, command A, in the daisy-chain loop 107 in a clockwise direction according to embodiments of the present disclosure. FIG. 7 shows the flow of response signals in the daisy-chain loop 107 in a counter-clockwise direction according to embodiments of the present disclosure.

Providing more details depicted in FIGS. 5-7, the host 102 may send a second command signal, command A, in the first direction 140, where the second command signal may request all of the clients 120 to send responses to the host. In response to the command signal, each client (e.g. 120*i*) may send a response signal (e.g. response i) to an adjacent client (e.g. 120*i*-1) in the second direction 142 and send the command signal to an adjacent client (e.g. 120*j*) in the first direction 140. Also, each client (e.g. 120*i*) may receive a response signal (e.g. response j) from an adjacent client (e.g. 120*j*) in the second direction 142 and send the response signal (e.g. response j) to an adjacent client (e.g. 120*i*-1) in the second direction 142. In embodiments, the responses from the clients 120 may sequentially arrive at the host 102, as depicted in FIG. 5.

If the daisy-chain loop 107 does not have any defect, the host 102 may the responses from all of the clients 120. However, if the wire between the clients 120*i* and 120*j* is broken, as depicted in FIG. 6, only the clients 120*a*-120*i* may send response signals to the host. Since the host 102 cannot receive the responses from the clients 120*j*-120*n*, the host 102 may send another command signal along the direction 142, requesting all of the clients 120*a*-120*n* to send responses to the host.

Figure 8:
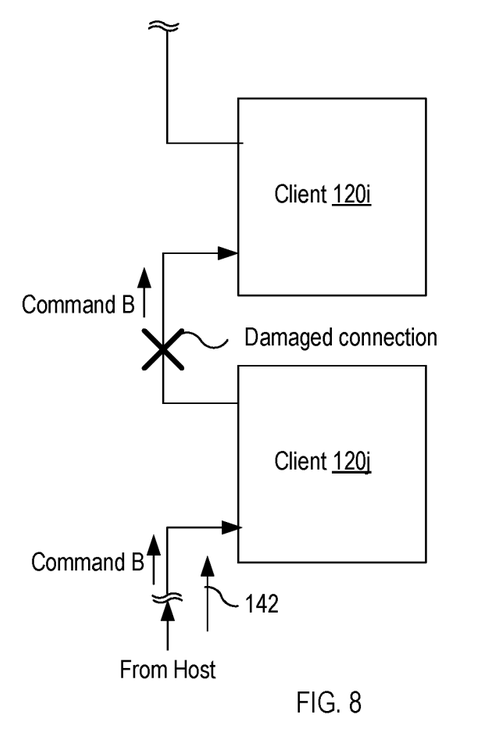
FIG. 8 shows the flow of a command signal in a daisy-chain loop according to embodiments of the present disclosure.
Figure 9:
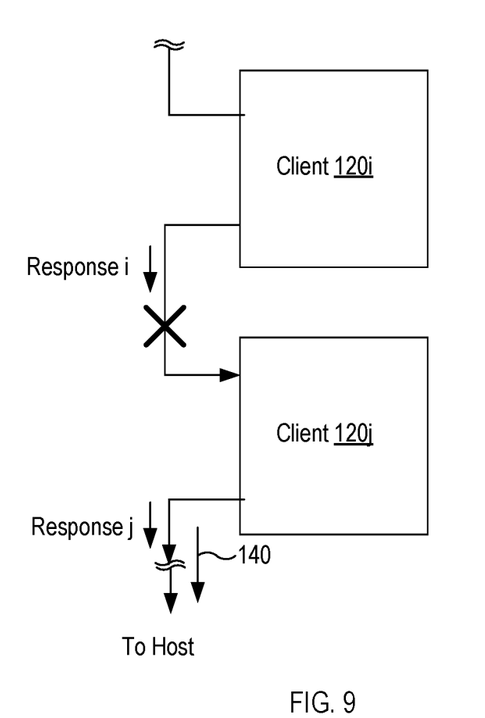
FIG. 9 shows the flow of response signals in a daisy-chain loop according to embodiments of the present disclosure.
Figure 10:
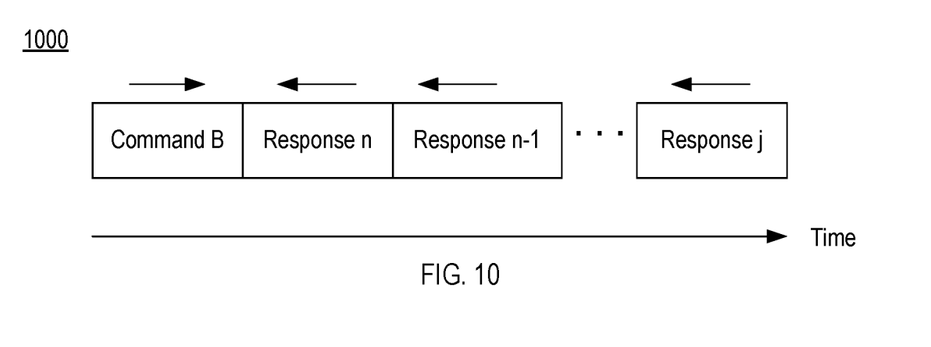
FIG. 10 shows a schematic diagram of a data sequence received by a host according to embodiments of the present disclosure.

FIG. 8 shows the flow of the command signal, command B, in the daisy-chain loop 107 according to embodiments of the present disclosure. FIG. 9 shows the flow of response signals in the daisy-chain loop 107 according to embodiments of the present disclosure. FIG. 10 shows a schematic diagram of a data sequence 1000 received by the host 102 according to embodiments of the present disclosure. As depicted in FIGS. 8-10, the responses from only the clients 120*n*-120*j* may arrive at the host since the clients 120*a*-120*i* cannot receive the command or send responses due to the defect in the daisy-chain loop 107. By comparing the data sequences 500 and 1000, the host 102 may determine that the wire (or wire connection) between the clients 120*i* and 120*j* is defective.

It is noted that the host 102 can identify the failure by sending the second command signals in the bi-directional mode, where each second command signal requests all of the client 120 to send response to the host 102. Also, the bi-directional mode may allow the host 102 to receive the responses from all of the clients 120, even if the daisy-chain loop 107 is broken. If the daisy-chain loop 107 does not have any defect, the host 102 may receive two sets of responses, where each set of responses include responses from all of the client 120.

Figure 11:
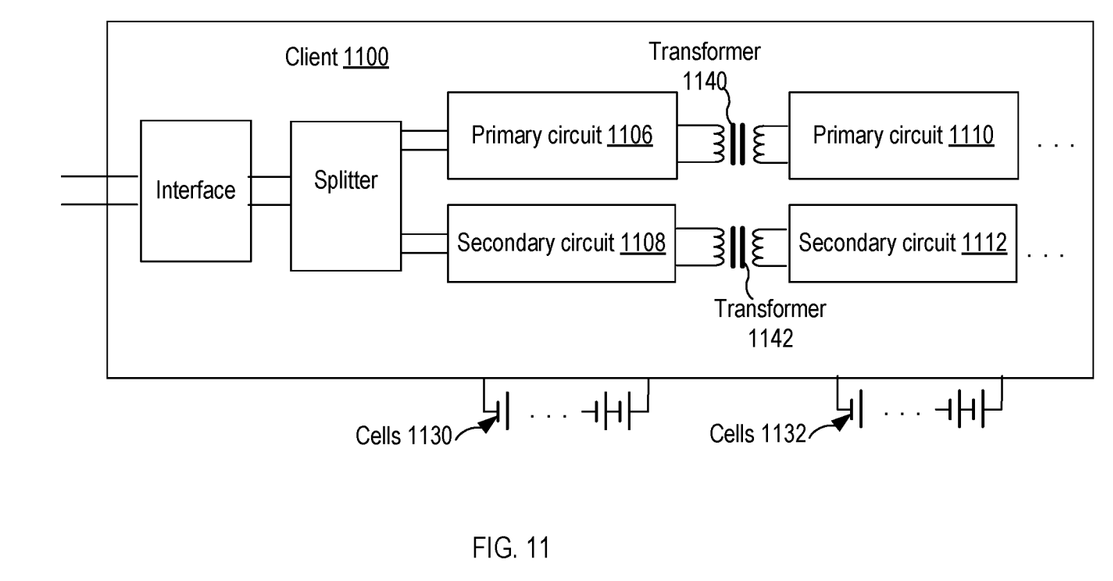
FIG. 11 shows a schematic diagram of a client according to embodiments of the present disclosure.

FIG. 11 shows a schematic diagram of a client 1100 according to embodiments of the present disclosure. As depicted, the client 1100 may be similar to the client 300, with the difference that the client 1100 has two primary circuits 1106 and 1110 and two secondary circuits 1108 and 1112. In embodiments, the primary circuit 1106 may be isolated from the primary circuit 1110 by a transformer 1140 and the second circuit 1108 may be isolated from the secondary circuit 1112 by a transformer 1142. It is noted that other suitable electronic circuit may be used in place of the transformers 1140 and 1142.

In embodiments, the primary circuit 1106 and the secondary circuit 1108 may monitor the cells 1130, and the primary circuit 1110 and the secondary circuit 1112 may monitor the cells 1132. It is noted that the client 1100 may include more than two primary (and/or secondary) circuits to monitor additional number of cells, where the primary (and secondary) circuits may be arranged in series and separated by transformers to isolate the neighboring primary (and secondary) circuits. As such, the client 1100 can scale to support various numbers of battery cells by integrating circuitry within the client 1100.

Figure 12:
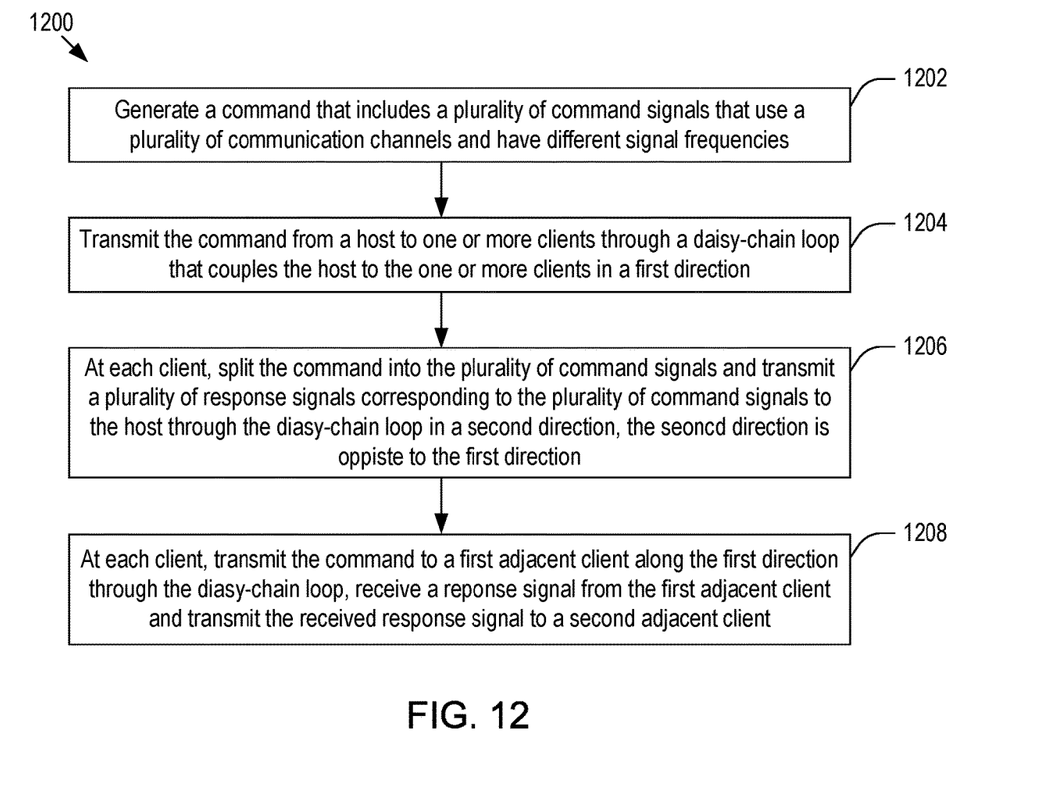
FIG. 12 shows a flowchart of an illustrative process for communicating data in a battery management system according to embodiments of the present invention.

FIG. 12 shows a flowchart 1200 of an illustrative process for communicating data in the battery management system 100 according to embodiments of the present invention. The host 102 may generate a command that includes a plurality of command signals, where each of the command signals uses a communication channel at a frequency (step 1202). In embodiments, the command may include two command signals that use the first and second communication channels associated with signals in Figured 2A and 2B, respectively. The host 102 may transmit the command to the clients 120 through the daisy-chain loop 107 in a first direction 140 (step 1204). At each client 120, the command may be split into a plurality of command signals by the splitter 304 and a plurality of response signals corresponding to the plurality of command signals may be transmitted to the host through the daisy-chain loop 107 in a second direction 142 (step 1206). Also, at each client 120, the command may be transmitted to a first adjacent client along the first direction 140 through the daisy-chain loop 107. In addition, each client 120 may receive a response signal from the first adjacent client in the daisy-chain loop 107 and transmit the received response signal to a second adjacent client (step 1208).

Figure 13:
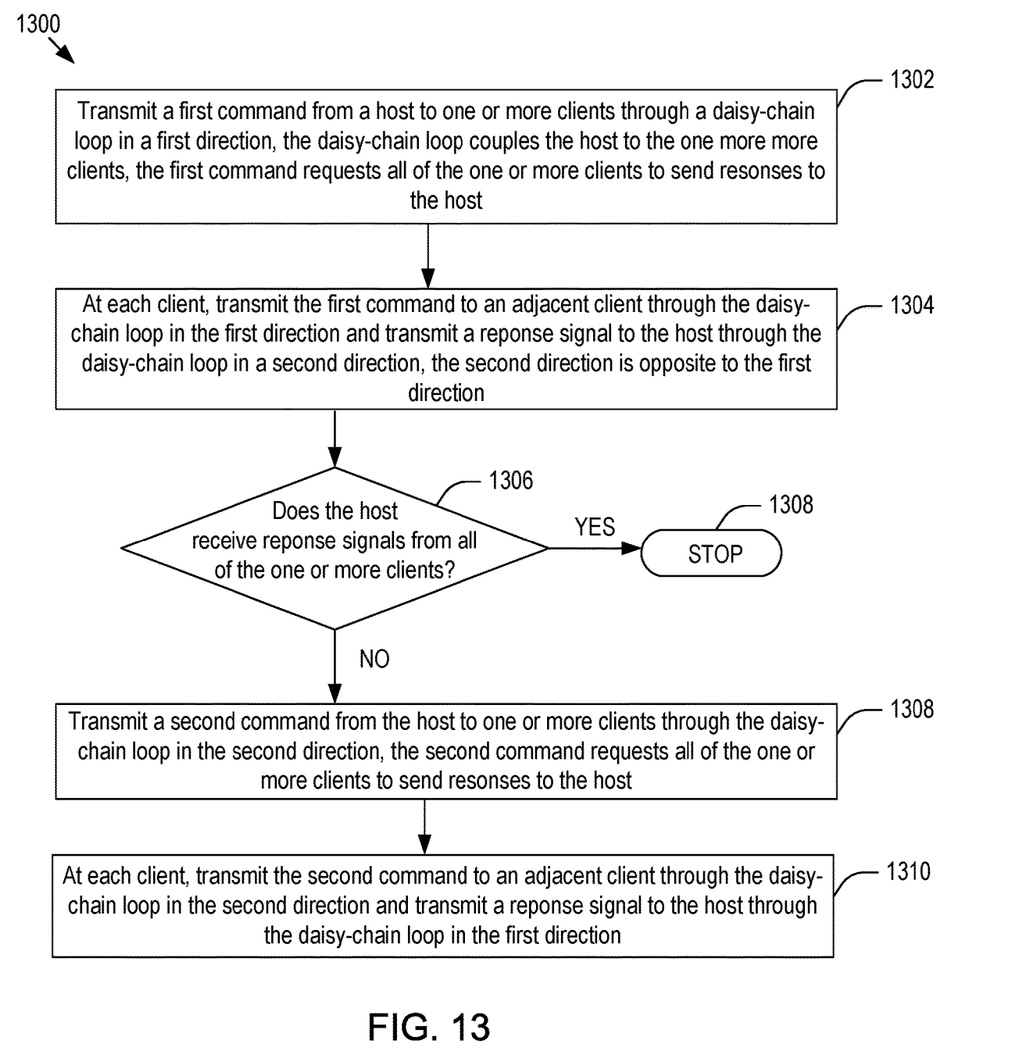
FIG. 13 shows a flowchart of an illustrative process for communicating data in a battery management system according to embodiments of the present invention.

FIG. 13 shows a flowchart 1300 of an illustrative process for communicating data in the battery management system 100 according to embodiments of the present invention. The host 102 may transmit a first command to the clients 120 through the daisy-chain loop 107 in a first direction 140, where the first command requests all of the clients 120 to send responses to the host (step 1302). Each client may transmit the first command to an adjacent client through the daisy-chain loop 107 in the first direction 140 and transmit a response to the host 102 through the daisy-chain loop 107 in a second direction 142 (step 1304). Then, it is determined whether the host 102 receives response signals from all of the clients 120 (step 1306). If the answer to the decision at step 1306 is positive, the process stops (step 1308). Otherwise, the host 102 may send a second command to the clients 120 through the daisy-chain loop 107 in the second direction 142 (step 1308). Each client may transmit the second command to an adjacent client through the daisy-chain loop 107 in the second direction 142 and transmit a response signal to the host 102 through the daisy-chain loop 107 in the first direction 140 (step 1310).

It will be appreciated to those skilled in the art that the preceding examples and embodiment are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

What is claimed is:

1. A redundant battery management system comprising:
   a first client coupled within a multi-channel, bi-directional and daisy-chained communication loop, wherein the first client manages a first plurality of battery cells and comprises:
      a first interface coupled to the communication loop;
      a first splitter coupled to received data from the first interface and to split the data across at least two outputs on the first splitter;
      a first primary circuit coupled to receive at least a first portion of the data from a first output of the first splitter and to transmit data on a first channel within the communication loop;
      a first secondary circuit coupled to receive at least a second portion of the data from a second output of the first splitter and to transmit data on a second channel within the communication loop;
   a second client coupled to the communication loop, wherein the second client manages a second plurality of battery cells and comprises:
      a second interface coupled to the communication loop;
      a second splitter coupled to received data from the second interface and to split the data across at least two outputs on the second splitter;
      a second primary circuit coupled to receive the at least first portion of the data from a first output of the second splitter and to transmit data on the first channel within the communication loop;
      a second secondary circuit coupled to receive the at least second portion of the data from a second output of the second splitter and to transmit data on the second channel within the communication loop; and
   a host coupled to the communication loop, wherein the host manages a plurality of clients coupled to the communication loop, the plurality of clients comprising at least the first and second clients, and wherein the host is configured to:
      provide a request via the communication loop, and
      receive one or more responses via the communication loop, wherein each response of the one or more responses is associated with a respective client of the plurality of clients based on a response window associated with the response.

2. The system of claim 1 wherein the at least second portion of the data is a redundant copy of the at least first portion of the data.

3. The system of claim 1 wherein the at least first portion of the data is specifically addressed to at least one client within the plurality of clients and the at least second portion of the data is broadcast to the plurality of clients.

4. The system of claim 1 wherein the first splitter comprises a first filter that separates and transmits the at least first portion of the data from the data received from the communication loop, the at least first portion of the data being communicated on a first channel.

5. The system of claim 4 wherein the first splitter further comprises a second filter that separates and transmits the at least second portion of the data from the data received from the communication loop, the at least second portion of the data being communicated on a second channel.

6. The system of claim 1 further comprising an isolation element coupled between the first client and the communication loop, the isolation element isolates the first client from the communication loop.

7. The system of claim 6 wherein the isolation element comprises a transformer.

8. The system of claim 1 wherein the host communicates with the plurality of clients using a frequency division multiplexed signaling architecture that employs a balanced serial signal protocol.

9. The system of claim 1 wherein the host communicates with the plurality of clients using a frequency division multiplexed signaling architecture that employs FSK modulation.

10. The system of claim 1 wherein the first client device measures and transmits at least one physical or electrical measurement associated with the first plurality of battery cells in response to a request from the host received from the communication link.

11. The system of claim 1 wherein the first client device performs at least one function on the first plurality of battery cells in response to a request from the host received from the communication link.

12. A method for identifying a failure location within a battery management system, the method comprising:
transmitting a first request from a host to a first client within a plurality of clients, the request being transmitted on a first channel and in a first direction on a bidirectional and multi-channel communication path coupling the plurality of clients in a daisy-chained architecture;
receiving a frequency division multiplexed signal at the first client, the frequency division multiplexed signal comprising the first channel;
filtering the first channel from the frequency division multiplexed signal at the first client;
processing the first request within the first channel at the first client; and
transmitting a response related to the first request from the first client to the host on the bi-directional and multi-channel communication path, the response being transmitted in a second channel within the multi-channel communication path,
wherein the host associates the response with the first client, from the plurality of clients, based on a response window associated with the response, the response window comprising a time or location associated with the response.

13. The method of claim 12 wherein the first and second channels are the same channel.

14. The method of claim 12 further comprising the step of re-transmitting the first request in a third channel within the multi-channel communication path in response to failing to receive the response from the first client at the host.

15. The method of claim 12 further comprising the step of re-transmitting the first request in a second direction in the bi-directional communication path in response to failing to receive the response from the first client at the host.

16. The method of claim 15 further comprising the step of identifying a failure point within the communication path based on an analysis of the first request transmitted in the first direction of the bi-directional communication path and the first request transmitted in the second direction of the bi-directional path.

17. The method of claim 12 wherein the processing of the first request at the first client comprises performing a physical or electrical measurement on at least one battery cell within a plurality of battery cells managed by the first client.

18. The method of claim 12 wherein the processing of the first request at the first client comprises performing a function on at least one battery cell within a plurality of battery cells managed by the first client.

19. A method for managing a plurality of daisy-chained clients within a battery management system, the method comprising:
transmitting a first plurality of requests to the plurality of daisy-chained clients in at least one channel within a plurality of channels in a bi-directional and multichannel communication loop, each of the requests within the first plurality of requests being specifically addressed to at least one client within the plurality of clients;
transmitting a second plurality of requests to the plurality of daisy-chained clients in a broadcast channel within the plurality of channels in the bi-directional and multi-channel communication loop, the second plurality of requests being broadcasted to the plurality of clients and the broadcast channel being distinct from the at least one channel; and
awaiting, at a host, a first plurality of responses corresponding to the first plurality of requests and a second plurality of responses corresponding to the second plurality of requests,
wherein received responses of the first plurality of responses and second plurality of responses are associated with respective daisy-chained clients based on respective response windows associated with the received requests, wherein a response window comprises a time or location associated with a response.

20. The method of claim 19 wherein the second plurality of requests within the broadcast channel is generated in response to failing to receive a response within the first plurality of responses associated within the first plurality of requests specifically addressed to the at least one client.

21. The method of claim 20 wherein a failure location within the communication loop is identified based on an analysis of the second plurality of responses corresponding to the broadcasted second plurality of requests.

22. The system of claim 1, wherein a failure location within the communication loop is identified based, at least in part, on the one or more responses.

23. A redundant battery management system comprising:
a first client coupled within first communication loop, wherein the first client manages a first plurality of battery cells and comprises a first interface coupled to the communication loop and configured to transmit data on a first channel and a second channel within the communication loop;
a second client coupled to the communication loop, wherein the second client manages a second plurality of battery cells and comprises a second interface coupled to the communication loop and configured to transmit data on the first channel and the second channel within the communication loop; and a host coupled to the communication loop, wherein the host manages a plurality of clients coupled to the communication loop, the plurality of clients comprising at least the first and second clients, and wherein the host is configured to:

provide a request via the communication loop, and receive one or more responses via the communication loop, wherein each response of the one or more responses is associated with a respective client of the plurality of clients based on a response window associated with the response.

* * * * *